United States Patent [19]
Glucksman et al.

[11] Patent Number: 5,777,886
[45] Date of Patent: Jul. 7, 1998

[54] PROGRAMMABLE LEAD CONDITIONER

[75] Inventors: Michael D. Glucksman, Plano; Weerakiat Wahawisan, Carrollton; Troy D. Moore, Garland; Paul H. Hasten, Dallas; Dennis M. Botkin, Seagoville; James E. Loveless, Carrollton; Joseph Antao, Plano; Michael C. Zemek, Rowlett; Rajiv Roy, Plano, all of Tex.

[73] Assignee: Semiconductor Technologies & Instruments, Inc., Dallas, Tex.

[21] Appl. No.: 275,162

[22] Filed: Jul. 14, 1994

[51] Int. Cl.$^6$ ...................................... H05K 3/30
[52] U.S. Cl. ............... 364/489; 29/825; 29/835; 29/838; 140/105; 140/123; 140/147; 901/47
[58] Field of Search .................... 140/105, 147, 140/123; 29/564.1, 835, 838, 825, 837; 364/489, 488, 490, 491, 560, 474; 901/47

[56] References Cited

U.S. PATENT DOCUMENTS

| | | | |
|---|---|---|---|
| 4,063,347 | 12/1977 | Woolman, Jr. | 29/564.1 |
| 4,387,506 | 6/1983 | Wright et al. | 29/714 |
| 4,450,619 | 5/1984 | Wright et al. | 29/564.1 |
| 4,705,081 | 11/1987 | Birk et al. | 140/147 |
| 5,185,811 | 2/1993 | Beers et al. | 382/8 |
| 5,219,404 | 6/1993 | Moore et al. | 140/147 |
| 5,273,081 | 12/1993 | Maksim | 140/105 |
| 5,406,372 | 4/1995 | Vodanovic | 356/394 |
| 5,487,416 | 1/1996 | Maksim | 140/105 |

FOREIGN PATENT DOCUMENTS

WO 92/09382  11/1991  WIPO.

OTHER PUBLICATIONS

IEMET 1992 12th National Electronic Manufacturing Technology Symposium Apr. 1992, Mainz, Germany, pp. 147–154, G. Schiebel, 'Automatic Gang Bonding, The Alternate Process'.

*Primary Examiner*—Jacques H. Louis-Jacques
*Assistant Examiner*—Thai Phan
*Attorney, Agent, or Firm*—Akin, Gump, Strauss, Hauer & Feld, L.L.P.

[57] ABSTRACT

A lead conditioning system (10) conditions leads (74) of electronic component package (30) and includes a rotary table (16) for holding electronic component package (30) and making accessible the leads (74). A conditioning tool (20) includes conditioner arm (34) and conditioner blade (70) that selectively contacts a predetermined number of the leads (74). A manipulator (22) moves conditioning tool (20) to positions that contact a predetermined number of leads (74) to condition leads (74). A control system (24) controls the operation of manipulator (22).

22 Claims, 6 Drawing Sheets

PROGRAMMABLE LEAD CONDITIONER

TECHNICAL FIELD OF THE INVENTION

The present invention relates to a system and method for processing electronic devices and, more particularly, to a programmable lead conditioning system for properly adjusting electronic component package leads.

BACKGROUND OF THE INVENTION

Unintended deformation of electronic component package leads is a well-known problem in the electronics industry. Heretofore, this problem has been dealt with by manually manipulating leads back into their correct shape when deformation occurs. The problem with this method, however, is that as lead pitch decreases, manual adjustment becomes increasingly difficult. Moreover, as electronic component package processing becomes more automated, manual manipulation becomes less efficient. Manual working and handling of electronic component package for lead conditioning, therefore, becomes less desirable.

U.S. Pat. No. 5,219,404 to T. P. Moore, et al., entitled "Lead Conditioner for Quad Semiconductor Packages" and assigned to Texas Instruments, Inc., Dallas, Tex., hereinafter Moore describes a lead conditioning system that provides an offset conditioner, a planarity conditioner, and a tweeze conditioner station together with a centering station, transport assembly, and a cabinet that has an input station and an output station together with an electronic control apparatus. The offset conditioner conditions the offset space in between leads of the electronic component package by shifting the leads axially in both directions and returning the leads to a center position according to a predetermined specification. The planarity conditioner station deforms the leads so that they are essentially upright and then repositions the leads by exerting forces downwardly on the tips of the leads. This makes the tips of the leads essentially shifted to a coplanar position according to a predetermined specification. The offset conditioner features a self-centering device with blades which accurately center the semiconductor device when the self-centering device is lowered thereover. The offset conditioner also features a blade unit which is constructed with successive laminations of steel for enhancing strength and durability of the blades.

Although the invention of Moore provides numerous technical advantages, it also suffers from certain limitations. For example, the Moore system requires tooling for every electronic component package size difference. In the Moore device, combs are run through the electronic component package leads. These combs must correspond to the space between the leads of the electronic component package. To condition the leads of a package where the spacing is different, a different comb is required. This necessitates replacing the comb and using a different comb for the package. This change in tooling consumes time and limits throughput of the electronic component packages.

Another limitation of Moore and other conventional devices is the amount of force required to condition the leads. Because electronic component packages generally include so many leads, as much as 250 pounds of force may be required to actuate the mechanism that conditions all of the leads of the package. This amount of force could cause damage to the leads if the package is not properly aligned.

Still a further limitation that exists in conventional devices is the inability to both inspect and condition the leads in a single processing setup. This inability limits the throughput of semiconductor device packages that are conditioned, since the semiconductor device package either has to be rerun through the system or moved upstream against the normal process flow.

Yet another limitation of conventional lead conditioning systems such as that of Moore is their conditioning of all leads on a side of an electronic component package irrespective of whether a lead needs conditioning. The action of conditioning a lead causes some amount of disturbance to the surface finish of that lead. This may just be a marking of the lead that can only be seen under a 20× magnification, but there is also the potential of damaging the lead, or creating solder slivers, or dislodging solder flakes from the lead. This can generally degrade the operation of a semiconductor device by conditioning a lead that in the first place required no conditioning.

SUMMARY OF THE INVENTION

Therefore, a need has arisen for a lead conditioning system that does not require additional tooling or the associated cost of purchasing and maintaining that tooling.

There is a need for a lead conditioning system that does not require the time of changing the combs or tools that condition the leads.

There is a need for an improved lead conditioning system that does not present the potential to expose the electronic component package to the large conditioning forces of known lead conditioning systems.

There is a further need for an improved lead conditioning system for electronic component packages that permits simultaneous and iterative conditioning and inspection of the electronic component package leads.

There is yet a further need for an improved lead conditioning system that limits the potential lead damage that may arise from conditioning individual leads that require no conditioning.

In accordance with the present invention, a programmable lead conditioning system is provided that substantially eliminates or reduces disadvantages and problems associated with previously developed lead conditioning systems.

More specifically, the present invention provides a lead conditioning system for conditioning the leads of an electronic component package that includes a table for holding the electronic component package and making accessible the leads. The conditioning tool selectively contacts a predetermined number of the leads. A manipulator moves the conditioning tool in three dimensions to position the contacted predetermined number of leads to condition the predetermined leads. A control system controls the operation of the manipulator.

The table may be, for example, a rotary table that turns the electronic component package to allow access to all of its sides. The conditioning tool may be a single blade tool for contacting the single lead, a multiple blade tool for contacting selective multiple leads, or a bar that moves leads in or out. The manipulator has the ability to move the conditioning tool in three dimensions to correct for planarity, pitch, and tweeze in the selected leads. The manipulator may be, for example, a stepper motor, a linear stepper motor, a servomotor, or a pneumatic actuator configuration that permits three-dimensional movement of the conditioning tool. The control system of the present invention may include the ability to calculate the amount of positioning required to condition the predetermined number of leads, as well as to maintain a database of various numbers of devices and to provide analysis of the conditioning of the predetermined number of such leads.

The present invention may also include a lead inspection system that inspects the leads of the electronic component package. The lead inspection system of the present invention works with the control system to precisely define the desired operation of a conditioning tool based on the results of the lead inspection analysis.

A technical advantage of the present invention is its flexibility over known lead conditioning systems. The programmable lead conditioner of the present invention makes all lead movement programmable and requires no hardware changeover when converting from one electronic component package type to another.

Another technical advantage of the present invention is that it in one system provides for both lead inspection and lead correction. The inspection portion of the present invention ties the lead conditioner frame of reference to the electronic component package frame of reference. This provides the exact location of every lead on the device for precise lead conditioning.

Another technical advantage of the present invention is that it could provide real-time analysis of the lead conditioning process. This information may be used to automatically adjust the conditioning process. For example, based on the real-time analysis, the lead conditioning system may position the conditioning tool, determine the necessary amount of tool movement, and assess the speed of conditioning tool positioning. The lead conditioning system may also be automatically shutdown if the leads are not capable of conditioning.

A further technical advantage of the present invention is that it eliminates the need for device-specific tooling. This virtually eliminates downtime required for package tool conversion that exists in conventional devices.

Another technical advantage of the present invention is that it integrates both lead inspection and conditioning to save cycle time for conditioning leads, as well as saving the floor space required for separate inspection and conditioning systems, and general semiconductor device package integrity by selectively conditioning only the leads that are bent.

Yet a further technical advantage of the present invention is that it selectively conditions only those leads that require conditioning. The present invention, therefore, limits the potential lead finish degradation to only the leads that require conditioning.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the FIGUREs like numerals being used to refer to like and corresponding parts of the various drawings.

Figure 1:
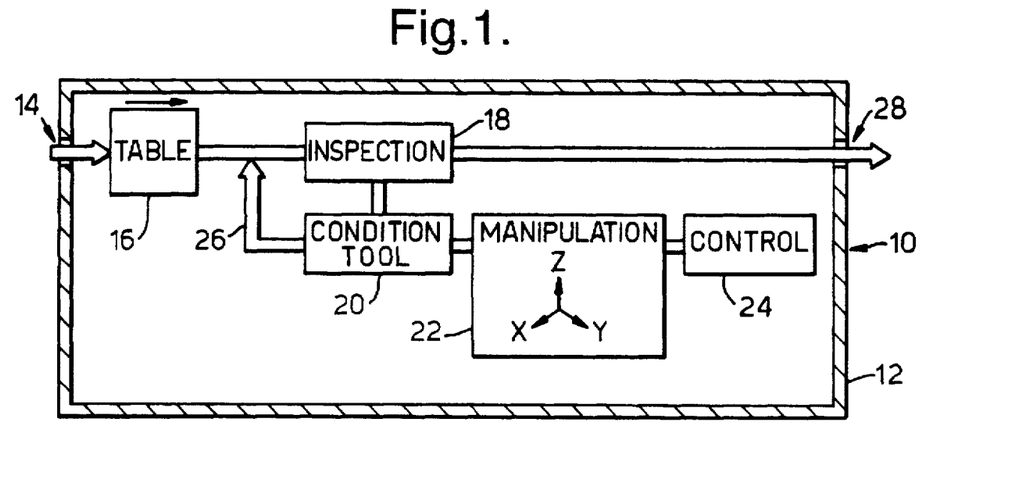
FIG. 1 illustrates a conceptual block diagram of the process flow for the lead conditioning system of the present embodiment.

Referring to FIG. 1, process flow through lead conditioning system 10 is shown schematically as beginning within chassis 12 which contains the components necessary to inspect and condition electronic device package leads. At input 14, the electronic device package enters lead conditioning system 10 and is positioned on table 16. While the electronic component package is on table 16, inspection system 18, inspects its leads to determine whether conditioning is required. If so, then conditioning tool 20 conditions the identified leads. Manipulator 22 has the ability to operate in three dimensions to control conditioning tool 20. Control system 24 controls the operation of manipulator 22. After conditioning, as path 26 indicates, reinspection may occur using inspection system 18. If no further conditioning is required, the electronic component package is removed from table 16 and exits lead conditioning system 10 at output 28. If further conditioning is required, on the other hand, conditioning tool 20 will perform the conditioning, and inspection may continue until no further conditioning is required.

Figure 2:
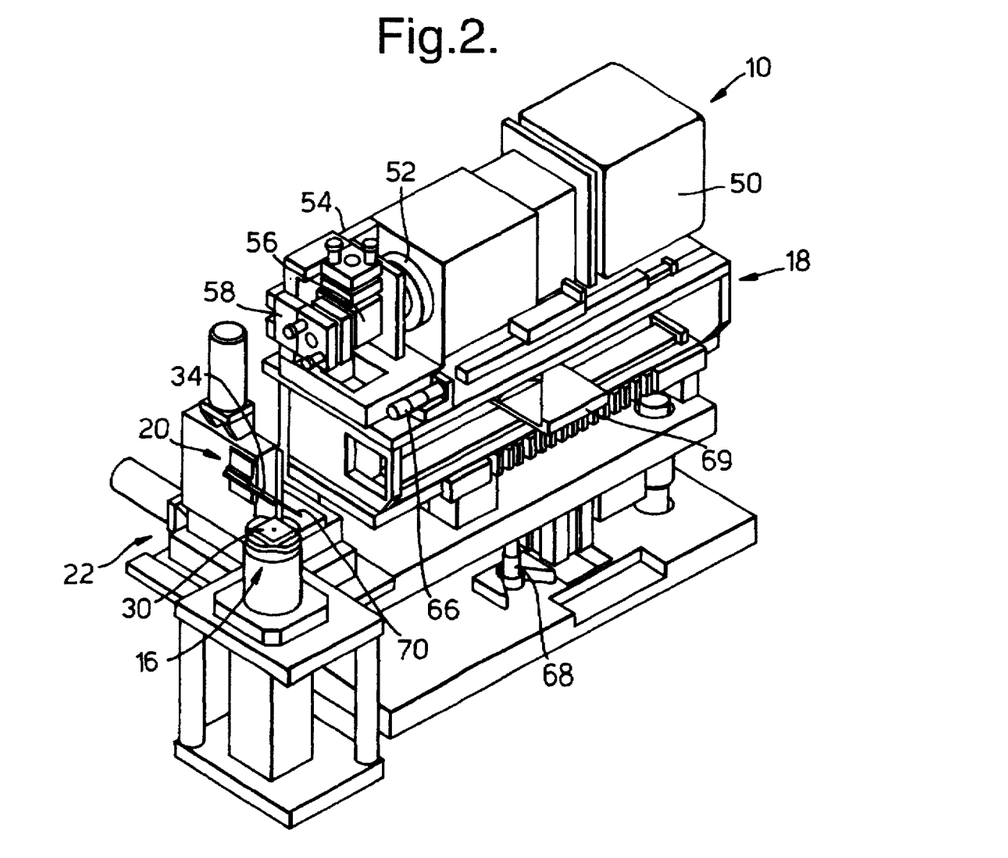
FIG. 2 shows an isometric view of the various operative components of the lead conditioning system of the present embodiment.

Referring to FIG. 2, there is an isometric diagram of one embodiment of the invention that includes inspection system 18 that views electronic component package 30 on rotary table 16. Conditioning tool 20 includes conditioner arm 34. Conditioning tool 20 connects to manipulator 22. Manipulator 22 has the ability to move conditioning tool 20 in the X, Y, and Z directions for three-dimensional control of conditioner arm 34. Manipulator 22 includes X-directional stepper motor 36 that controls the movement of X-translation table 38. Y-direction stepper motor 40 controls the movement of Y-direction translation table 42. Z-direction stepper motor 44 controls the direction of movement for Z-direction translation table 46.

Lead inspection system 18 includes an optical system that has camera 50 for recording the position of leads on electronic component package 30. Camera 50 includes lens 52 which receives an image that upper image adjustment mechanism 54 adjusts by varying the position of beam splitter 56. Beam splitter 56 is further controlled by lower image adjustment 58. Additional controls for lead inspection system 18 include magnification adjustment 64 and fine focus adjustment 66 that more precisely focuses the image that camera 50 receives. Optical platform height micrometer 68 adjusts the height of lead inspection system 18. In order to precisely determine the amount of conditioning required for the leads of electronic component package 30, conditioner arm 34 includes a real-time reference (see FIGS. 6a, 6b, 7a, and 7b below).

Cabinet 12 is conventional in nature and is primarily housing for lead conditioning system 10 as well as for providing physical support to the various stations and protection from the environment. Cabinet 12 may have individual compartments storing different components of lead conditioning system 10, such as a compartment for electronic control system 24. In addition, certain technical considerations of the present embodiment may be more easily understood with reference to U.S. Pat. No. 5,219,404, entitled "Lead Conditioner for Quad Semiconductor Packages." by Troy D. Moore, et al. (some of the inventors being common to the inventors hereof) and assigned to Texas Instruments Incorporated of Dallas, Tex. (hereinafter Moore). For this purpose, Moore is here incorporated by reference.

Transport within conditioning system 10 of the present embodiment is an automated, tray-to-tray system which includes structures suitable for automated conveyance of electronic component packages 30 from input 14 (and any other stations appropriate to cabinet 12) to rotary table 16 where lead inspection and conditioning may take place. Indeed, the transport within lead conditioning system 10 could be automated to the point of introducing electronic component packages 30 into input point 14 and out of output location 28, if desired. Such transport assemblies are well-understood in the art and, therefore, will not be described in greater detail here.

Lead conditioning system 10 of the present embodiment also provides the ability to condition electronic component packages that are in tubes or other types of device containers. With the present invention, an embodiment may be configured to inspect and condition electronic component packages without removing them from their tray.

Rotary table 16 may be any station which relatively precisely locates electronic component package 30 and which holds electronic component package 30 in place. For example, in the present embodiment, rotary table 16 includes a chuck that has vacuum ports through which a vacuum is drawn. The chuck and its vacuum hold electronic component package 30 in place using a vacuum force. An advantage of the present embodiment is that relatively little force (e.g., less than 10 pounds) is necessary to hold the electronic component package during conditioning. This is in contrast to the conventional systems which may require as much as 250 pounds force to actuate the conditioner mechanism.

Figure 3:
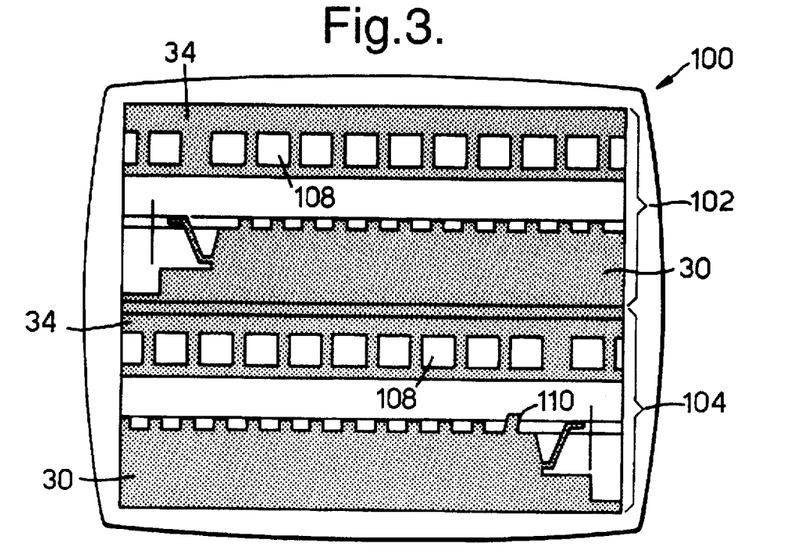
FIG. 3 shows an exemplary screen that a monitor associated with the present embodiment shows to indicate the need for conditioning one or more leads of an electronic component package.

FIG. 3 depicts a monitor screen 100 that shows the image from camera 50 of inspection system 18. Monitor screen 100 is split into upper screen portion 102 and lower screen portion 104. In upper screen portion 102 part of a side of electronic component package 30 appears. In lower screen portion 104 the remaining part of the same side of electronic component package 30. Upper screen portion 102 shows conditioner arm 34 that includes reference square openings 108. Square openings 108 show the relative position of leads 74 of electronic component package 30 and, as will be discussed below in much detail, provides the necessary reference for measuring the necessary degree of conditioning for each lead. Bottom screen portion 104 also shows conditioner arm 34 with square openings 108 along with the rest of electronic component package 30. Note that, for illustrative purposes, lead 110 is shown bent. Square openings 108, as will be described more fully below, show the amount of bending to which lead 110 is subject. By splitting screen 100 into upper portion 102 and lower portion 104, the present embodiment makes possible more detailed examination of each individual lead 74.

Figure 4A:
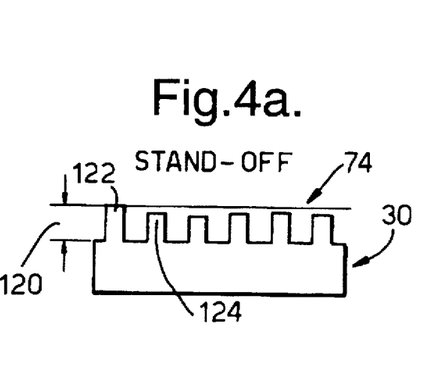
FIGS. 4a through 4d illustrate the various conditions of standoff, sweep, pitch, and bent leads that the present embodiment addresses in an electronic component package.

For illustrative purposes, FIGS. 4a through 4d show situations that exist with leads that the present embodiment of the invention can both identify and remedy as necessary. For example, FIG. 4a shows device standoff using distance indication 120. Note that lead 122 has greater height than does lead 124. This height difference is referred to as the lead's coplanarity error. In FIG. 4a, lead 123 is the highest lead on a particular side of an electronic component package 30. This lead can establish the seating plane of package 30. In such case the lead 123 coplanarity error is zero. Lead 124 will have a coplanarity error greater than zero, since it is not touching the seating plane.

Figure 4B:
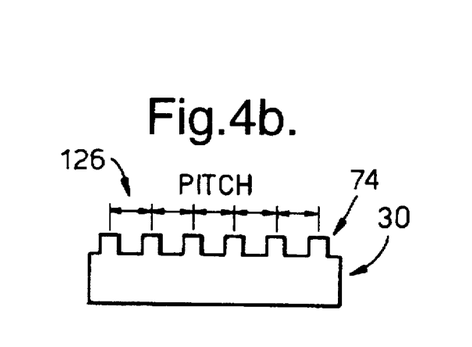
Figure 4C:
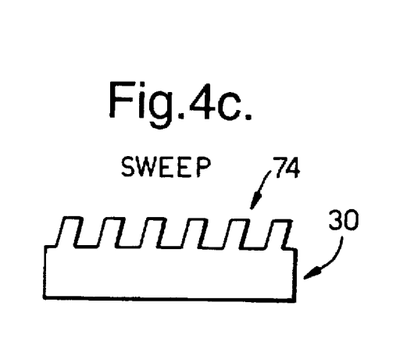
Figure 4D:
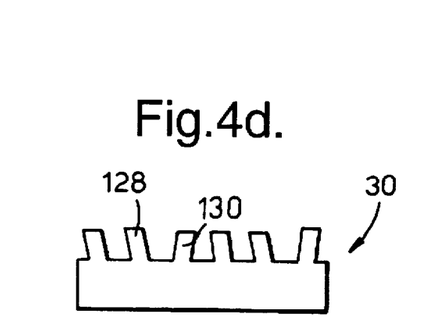

FIG. 4b shows the desired pitch between leads 74. Pitch should be uniform, in most instances, from one lead 74 to another. To assure that the pitch is proper, lead conditioning system 10 can independently adjust the position of each lead 74. FIG. 4c shows the problem of sweep that the present embodiment addresses. Due to contact or other problems, sweep may occur so that all leads 74 shifted laterally. By moving leads 74 in FIG. 4c, the present embodiment corrects for sweep. FIG. 4d shows the problem of bent leads. Leads 74 in FIG. 4d are moved in different directions. In addition, different pitches and standoff exist among the different leads 74 in FIG. 4d. For example, lead 128 is bent in a different direction than is lead 130. Using lead inspection system 18 of the present embodiment, each of these situations can be identified and, as necessary, corrected by conditioning one or more of the leads 74 of electronic component package 30.

Figure 5:
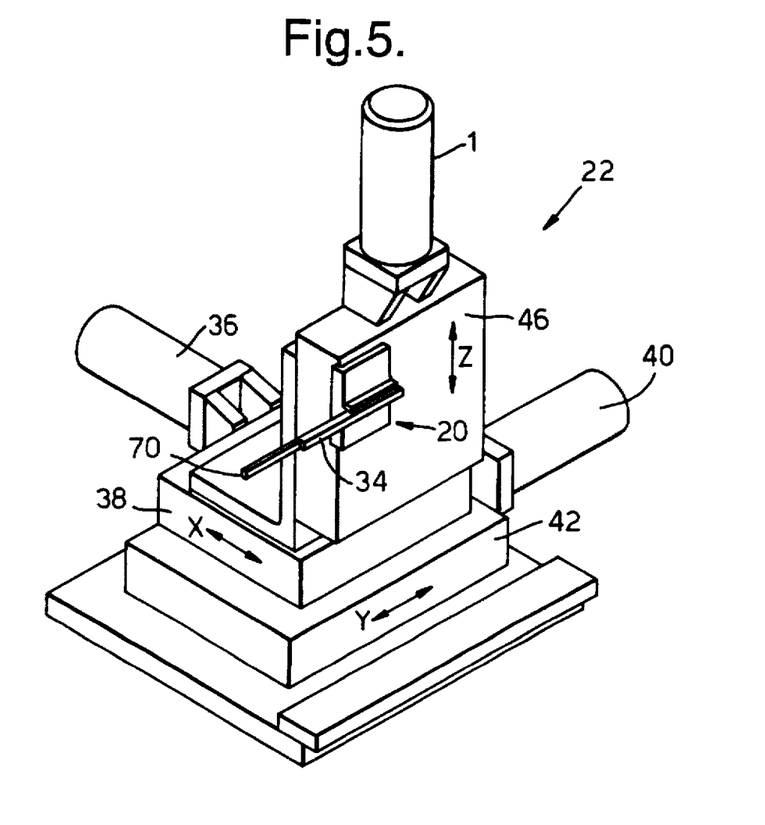
FIG. 5 illustrates the manipulator and conditioner arm configuration of the present embodiment.

FIG. 5 shows an isometric view of conditioning tool 20 together with manipulator 22. Conditioning tool 20 includes conditioner arm 34 to which conditioner blade 70 attaches. Conditioner arm 34 fastens to mount 140 which itself attaches to manipulator 22. In the X-direction, stepper motor 36 rotates and controls the motion of X-direction translation table 38. For Y-directional movement, stepper motor 40 rotates to cause movement of Y-direction translation table 42. X-direction movement is possible through control of stepper motor 44 that causes movement of Z-direction translation table 46. Angle arm 144 attaches between X-direction translation table 38 and Z-direction translation table 46 for vertical movement of Z-direction translation table 46. By precisely controlling stepper motors 36, 40, and 44, the present embodiment causes conditioner blade 70 to contact one or more leads to condition them as described below. Manipulator 22 fastens at base 146 which holds manipulator 22 rigidly in place while permitting movement of Y-direction translation table 42, X-direction translation table 38, and Z-direction translation table 46.

Figure 6A:
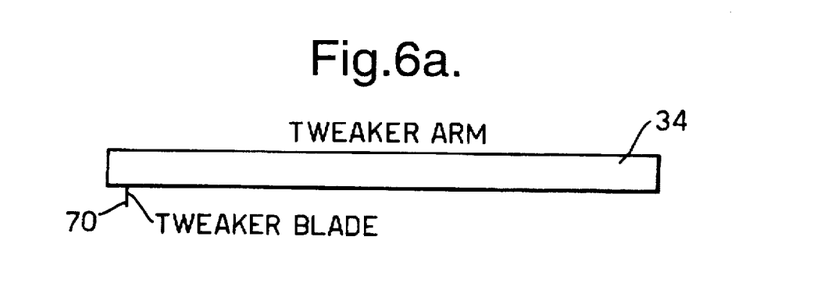
FIGS. 6a and 6b illustrate views of the conditioner arm of the present embodiment.
Figure 6B:
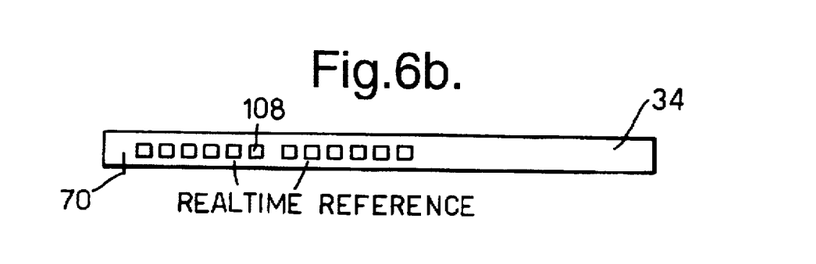

FIGS. 6a and 6b show the configuration of conditioner arm 34 that includes conditioner blade 70 and reference square opening 108. As can be seen in FIGS. 6a and 6b, conditioner arm 34 serves two functions. One function is to align individual leads of electronic component package 30. Conditioner blade 70 performs this function. Note, however, that conditioner blade 70 may be wider to accommodate the conditioning of more than one lead at a time. Instead, conditioner blade 70 may also be a bar that conditions a set of leads on a side of electronic component package 30. As FIG. 6b shows, conditioner arm 34 also serves the function of providing a real-time reference to lead inspection system 18. That is, by knowing precisely the spacing between and height of reference square openings 108, it is possible to discern to a high degree of accuracy that lead inspection system 18 requires.

There are generally tight tolerances on lead 74 positions for electronic component package 30, for example, in the case a surface mount package. As such, 100 percent inspection is required for these devices. The greater the accuracy and the more repeatable the inspection, the smaller are the guard bands and the lesser is the amount of over-kill in these devices. Lead inspection system 18 uses reference square openings 108 of conditioner arm 34 for increasing the accuracy of the lead inspection. This results in more accurate lead 74 conditioning. From the overhead view of FIG. 6a and the side view of FIG. 6b, the two functions of conditioner arm 34 become apparent.

Lead conditioning system 10 of the present embodiment combines lead inspection 18 and lead conditioning in one system. An important aspect of the present embodiment is the generic lead conditioning tool that conditioner arm 34 represents. Through the control system of the present embodiment, conditioner arm 34 may carry out a program of lead conditioning that automatically adapts to different types of devices based on an input parameter file.

Manipulator 22 is controlled by a host computer to move conditioner arm 34 in three dimensional space. Control system 24 is conventional in nature and may be a computer or microprocessor with the appropriate connective circuitry to the various stations as indicated schematically in FIG. 1. Lead conditioning system 10 conditions a bent lead using conditioner blade 70 to push the lead side-to-side or up and down. Since leads 74 are generally made of a metal which generally has a spring property, leads 74 are pushed beyond their initial positions to spring back to their normal positions. The amount of extra distance that the leads are pushed may be termed "overdrive." Lead conditioning system 10 of the present embodiment stores three separate overdrives for side-to-side, and up and down directions. These numbers also may be saved in a file associated with each device type.

Lead conditioning system 10 assumes that each lead 74 is in its correct position at the point where the lead 74 leaves electronic component package 30. Lead conditioning system 10 inserts conditioner blade 70 close to the lead 74 shoulder at electronic component package 30. Then, lead conditioning system 10 moves conditioner blade 70 up toward the tip of the lead before moving side to side in the direction opposite to the bending.

Lead conditioning system 10 conditions each lead 74 that is bent up by placing conditioner blade 70 above the lead 74 foot and pushing the lead 74 foot down. Leads that are bent down, are corrected by placing conditioner blade 70 below the lead foot and pushing it up. When a lead is bent up, generally it is bent in toward the package as well since the tip of the foot tends to move in an arc. Conversely, when a lead is bent down, generally it is bent outward. Therefore, correcting the height of the lead will generally correct the positioning in toward or away from the package. Conditioner arm 34 and conditioner blade 70 can move the lead in toward or away from the package as necessary, either as part of the height correction, or as an independent movement.

Another important aspect of the present embodiment is a real-time calibration function that permits more reproducible inspection measurements than conventional devices provide. The real-time calibration system of the present embodiment provides universal calibration tooling to reduce device-specific costs. Conditioner arm 34 includes numerous square openings 108 and rotary table 16 holds electronic component package 30. A technical advantage to the present invention is that the same rotary table 16 may be used for all devices of the same package size irrespective of the draft angle. In fact rotary table 16 may serve as a reference for conditioning calculations. In the present embodiment, therefore, conditioner arm square openings 108, the conditioner arm 34 lower edge and rotary table 16 are references for lead measurement and calibration. Square openings 108 provide both horizontal and vertical scale factors across the inspection field of view. This is especially helpful to correct horizontal parallaxtic errors which are not corrected with the calibration block technique, for example.

With reference to FIGS. 6a and 6b, software within control system 24 of the present embodiment uses a digital image of ten square openings 108 as interpolation zones which scan the lower edge of conditioner arm 34. Note, however, that the present embodiment of conditioner arm 34 includes 24 square openings 108. Depending on the magnification (which itself depends on the size of electronic component package 30), a variable number of square openings 108 come into the lead inspection system 18 field of view. The scale factors are calculated using the information stored in a file of control system 24. Since square openings 108 stretch across the X-axis of monitor 100, lead inspection system 18 finds the square edges (i.e., the vertical edges) that are furthest apart and measures these to calculate the X scale factor (e.g., at a scale of a predetermined number of mils per pixel). The Y scale factor is calculated from the average square opening 108 height.

Figure 7A:
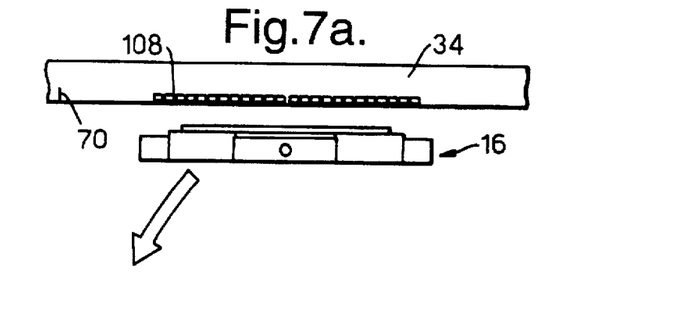
FIGS. 7a and 7b illustrate an aspect of the reference calculations that the real-time reference of the conditioner arm of the present embodiment make possible.
Figure 7B:
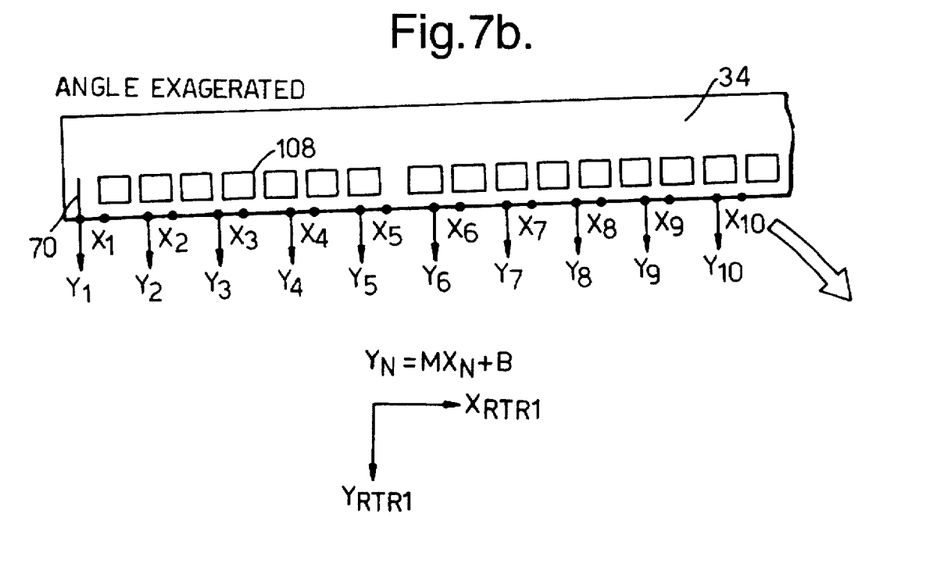

In FIGS. 7a and 7b, each of the ten square openings 108 is separated by a fixed horizontal distance. The software of control system 24 measures the height of the light-dark transitions that take place in the digital image signal. These values are used to calculate the position and angle of the lower edge by a mathematical method called linear regression. Linear regression averages the ten transition points and generates a two-dimensional line equation which represents the edge. The line equation is used to create the X-axis of a new coordinate system. The Y-axis is at a 90-degree downward angle from the plate lower edge. All measurements on this side are referenced to the new coordinate system.

In the present embodiment, each interpolation zone is a box three pixels wide and twelve pixels high. Square openings 108 determine the coordinate system X-axis reference line. Square openings 108 also provide vertical and height scale across the field of view of camera 50. The actual dimension of the features of square openings 108 are stored in a file within control system 24. Each plate has a serial number and, in operation, the file calls out the respective serial number. Each square opening is 0.050 inches on each side and are separated by 0.025 inches. The distance between the center opening is 0.050 inches wide to allow visual identification of the reference plate center during optical adjustment. In the present embodiment, the interpolation zones applied to the square openings 108 measure each side of each square opening 108 to determine the center of each opening. The individual square opening 108 measurements are averaged to minimize possible errors due to dust accumulation as well as to filter electrical noise.

The present embodiment further scans the upper edge of rotary table 16 with the interpolation zones to calculate the two-dimensional line equation of the edge of rotary table 16 by linear regression. A two-dimensional pedestal coordinate system is created from these measurements. Then, a transformation of the square opening 108 measurements with the rotary table 16 measurements occurs within the software of control system 24. In further implementing the lead inspection system of the present embodiment, a two-dimensional coordinate system is formed for each side of electronic component package 30 by rotating rotary table 16 and taking measurements associated with each of square openings 108 of conditioner arm 34.

Figure 8:
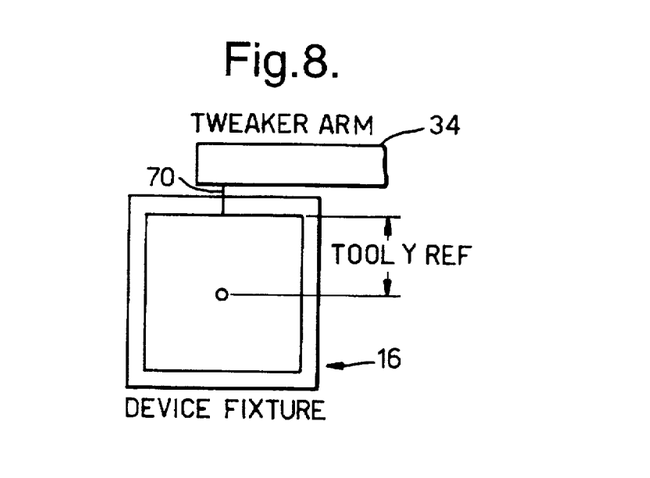
FIG. 8 illustrates a lead correction calibration operation using the present embodiment.

FIG. 8 shows an important aspect of the control system 24 of the present embodiment, which is the further calculation of a three-dimensional plane on rotary table 16 top surface. The two-dimensional coordinate systems that the present embodiment forms from the rotation of rotary table 16 and measurements relative to square openings 108 of conditioner arm 34 are used to calculate a three-dimensional plane. The pedestal plane is calculated to provide a reference coordinate system for the lead 74 tip measurements. The lead 74 tip locations which are measured in the two-dimensional coordinate systems are transferred to the three-dimensional coordinate system in the control system software. These measurements are used in the lead inspection process of the present embodiment.

OPERATION

The process of conditioning electronic component package 30 leads 74 will now be described. Although the lead inspection portion of the present embodiment or the lead conditioning system of a present embodiment may operate separately, the following discussion describes their use together. That is, lead conditioning system 10 may be used solely as an inspection station for inspecting leads 74 without performing the operation of conditioning. On the other hand, given a known need and measurements for conditioning one or more leads on an electronic component package 30, the lead conditioning aspect of the present embodiment may condition the designated leads independent of the inspection station. The conditioner would only need information on the package type and which leads need correction; neither the amount nor the direction of the bend would be required. With consideration of these matters, the following discussion details the operation of the system as a whole.

Referring again to FIGS. 1 through 8, an electronic component packages 30 is introduced into lead conditioning system 10 at input station 14 where an adjustment is made to insure proper placement. Electronic component package 30 is engaged by rotary table 16. Then, inspection system 18 operates to determine the need for conditioning leads of electronic component package 30. Conditioning tool 20 will condition the identified leads 74 of electronic component package 30 by manipulating conditioner arm 34 in the X, Y and Z directions. Control of manipulator 22 occurs through control system 24. The process can be iterative so that inspection system 18 continues to inspect until the desired conditioning of leads 74 occurs.

Lead conditioning system 10 of the present embodiment performs a program start-up function during initialization. In addition to initialization of camera 50 and the handler (not shown) of the system that places electronic component package 30 on rotary table 16, lead conditioning system 10 also initializes manipulator 22. Manipulator 22 moves its home sensors to define its home position in all three axes. Once home positions have been found, manipulator 22 will move conditioner arm 34 so that the real-time reference of square openings 108 line up with rotary table 16. This makes the system including rotary table 16 and square openings 108 ready for inspecting leads 74 of an electronic component package 30. Then, for computer control the system may display several menus on computer monitor 100 of control system 24. These menus permit the operator to select operations such as production, set-up, maintenance, and engineering operations.

In the conditioning operation, set-up is necessary. One set-up function is calibration of conditioner arm 34. This only needs to be done once during the initial reconditioning system 10 set-up or after camera 50 or conditioner arm 34 modification. The other set-up is the conditioner parameter set-up. This includes both a generic conditioner parameter set-up and some device dependent parameters. These parameters are set up for each device type.

Conditioner calibration orients the conditioner blade position information relative to camera 50 and rotary table 16. Conditioner blade 70 is positioned in the field of view of camera 50 in a known location in "X," and then camera 50 takes a picture and measures the values for "Y" and "Z" directly. During calibration, the camera's picture is shown on video monitor 100. This helps the user to position conditioner arm 34 relative to rotary table 16.

After calibrating conditioner arm 34, conditioner parameters are calibrated. These parameters are saved for each device type. The file name may be derived from the current device parameter file name with a new extension such as "*.twk". This file will be automatically loaded when the device is selected for conditioning.

In initializing lead conditioning system 10, parameters that the present embodiment includes are the following:

TABLE 1

CONDITIONER PARAMETERS

| | DEFINITION |
|---|---|
| OVERDRIVE_SIDE | The distance that conditioner arm 34 will push lead 74 past its normal point in the side-to-side direction. A default value of 5 mils is generally acceptable with most of the 10 mil leads. A user can increase or decrease this value based on a particular lead property. |
| OVERDRIVE_DOWN | Value for moving in the downward direction to compensate for lead 74 material properties. |
| OVERDRIVE_UP | Value for the move in the up direction to compensate for lead material properties. Default value of 5 mils. |
| LEAD_THICK | Thickness of each lead 74. Since the normal position of lead 74 is defined at the top of the lead in the dead-bug position, lead conditioning system 10 needs this amount to compensate for the push up distance. |
| FOOT_LENGTH | The length from the lead tip to the first bent position. Lead conditioning system 10 uses this number to define the distance that conditioner blade 70 must move in under lead 74 before it bends lead 74 up. |
| TOOL_Y-REFERENCE | Reference in Y-direction from the tip of conditioner arm 34 to the center of rotary table 16 during calibration. |
| TOOL_SPEED | Speed to move conditioner arm 34 in mils per second. |
| TOOL_ENABLE | A flag to turn on or off manipulator 22. The user can change this. This flag is enabled for lead conditioning system 10 to fix lead 74 during the run mode. |

Having initialized the conditioning portion of lead conditioning system 10, operation may further continue by the operator selecting a production mode from the monitor of a control system. If manipulator 22 has not been calibrated, lead conditioning system 10 prompts the operator to calibrate manipulator 22 and exit the production mode.

Otherwise, lead conditioning system 10 displays the normal lead conditioning system 10 production screen. The run mode of lead conditioning system 10 of the present embodiment includes a manual mode and an automatic mode. In the manual mode, to fix bent leads 74 the operator must inspect a device using an inspection command. Then, to fix a lead 74, the operator may enter a command to cause lead conditioning system 10 to fix the leads on all sides of the device. In the automatic mode, lead conditioning system 10 inspects each lead 74 first. Then lead conditioning system 10 conditions the identified leads only where inspection shows a bent lead. After leads 74 have been conditioned, lead conditioning system 10 reinspects electronic component package 30. If leads 74 are conditioned properly, the conditioned electronic component package 34 is moved from rotary table 16. However, if the lead 74 is bent beyond repair or the parameters are not set up properly, the leads 74 may not be fixed. In that case, the affected electronic component package 30 is either corrected a second time or moved from rotary table 16 to a reject sort.

An important part of the present embodiment is the processing operation in conjunction with lead inspection system 18. Thus, after initial calibration, lead inspection system 18 may begin by placing an electronic component package 30 on rotary table 16. In the lead inspection process, an electronic component package 30 is placed in rotary table 16. Leads on a first side are located. Measurements are transformed to the two-dimensional coordinate system applicable to the particular side of the package. Rotary table 16 is then rotated on each remaining side and scanned. The lead 74 positions on each side are transformed to the respective two-dimensional coordinate system. Then, the lead position vertical measurements are transformed into the three-dimensional coordinate system applicable to the plane of the rotary table 16. A three-point plane is then calculated, as a seating plane formed as if the electronic component package 30 were inverted and placed on a flat surface. Only three lead tips will touch the seating plane according to this calculation. The other lead tips may be very close to the seating plane, but only three will actually touch. In this formation, a triangle is formed in the calculations that connects the three leads which touch in the three-point plane.

A device center of gravity (as projected on the three-point plane) is inside this triangle. Note, however, that some devices may be by-stable which means that there are two centers of gravity because a side of the three-point plane passes near the center of the device. The common side of the two seating planes intersects the package center of gravity. All coplanarity measurements are from the three-point plane to each lead tip. Individual lead tip distances for the three-point plane are calculated to provide coplanarity measurements for the electronic component package 30. Then, the other lead measurements such as standoff, sweep, bent lead, and pitch may be determined for the electronic component package. With this information, control system 24 can appropriately actuate manipulator 22 to cause conditioner arm 34 to condition the individual leads.

Figure 9:
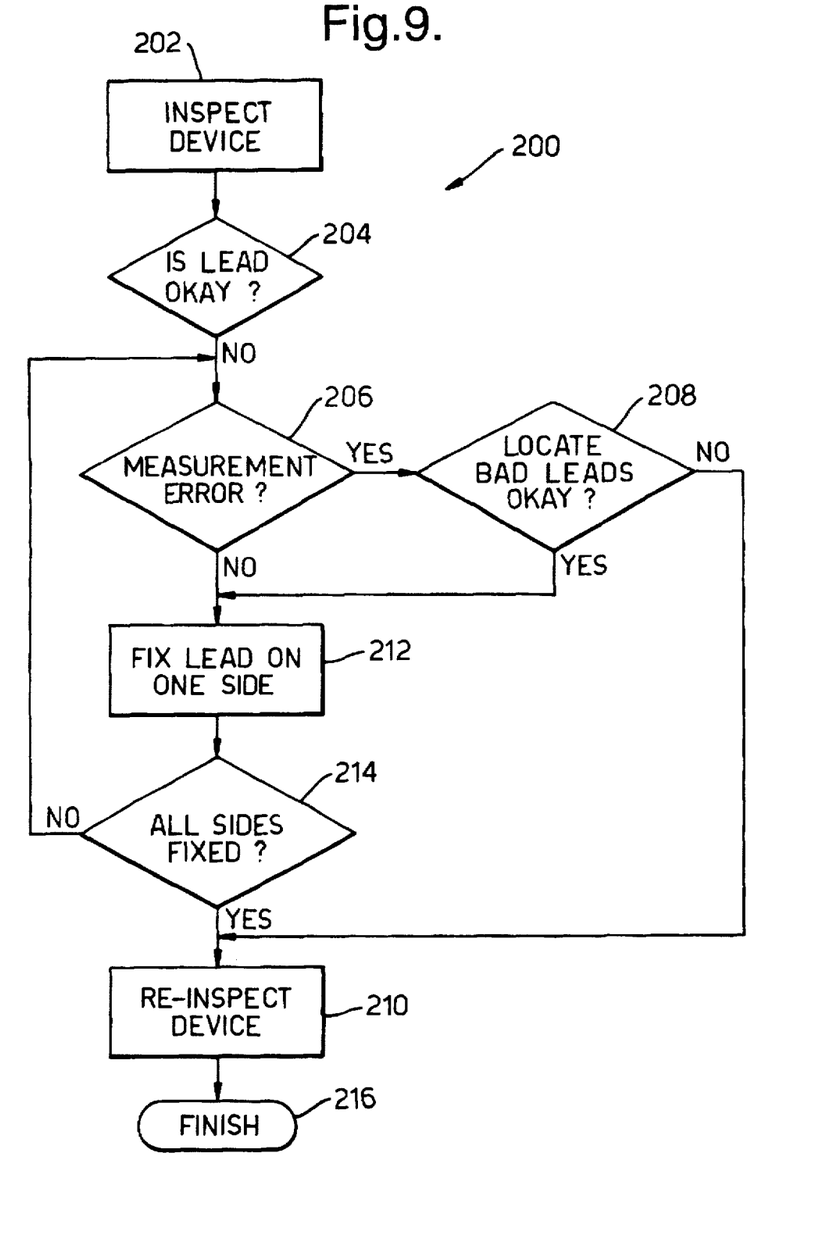
FIG. 9 illustrates an exemplary flow diagram that the control system of the present embodiment may employ for conditioning electronic component package leads.

FIG. 9 shows a flow chart 200 that further exemplifies the operation of the present embodiment. The combined inspection and conditioning begins, as described, at block 202 where lead inspection system 18 inspects electronic component package 30 and determines that electronic component package 30 has failed the inspection criteria. Then, as query 204 indicates, a test is made to determine whether the lead 74 is "okay." If not, lead inspection system 18 determines whether there is an error, as query 206 depicts. If there is a measurement error, then a query takes place, as query 208 indicates, to determine if it is possible to locate the bad leads. If not, program flow goes to block 210 at which point electronic component package 30 is reinspected. If there is no measurement error at query 206, or if it is possible to locate the bad leads, program flow goes to block 212 at which point lead conditioning system 10 fixes the lead on the side to which it has access. At query 214, lead conditioning system 10 tests whether all sides of electronic component package 30 have been fixed or conditioned. If all sides have been fixed or conditioned, then program flow goes to block 210 at which point electronic component device 30 is reinspected. Then, program flow goes to block 214 at which programmable lead conditioning finishes. This completes the process flow for leads 74 of each electronic component package 30 that lead conditioning system 10 conditions.

ALTERNATIVE EMBODIMENTS

Figure 10:
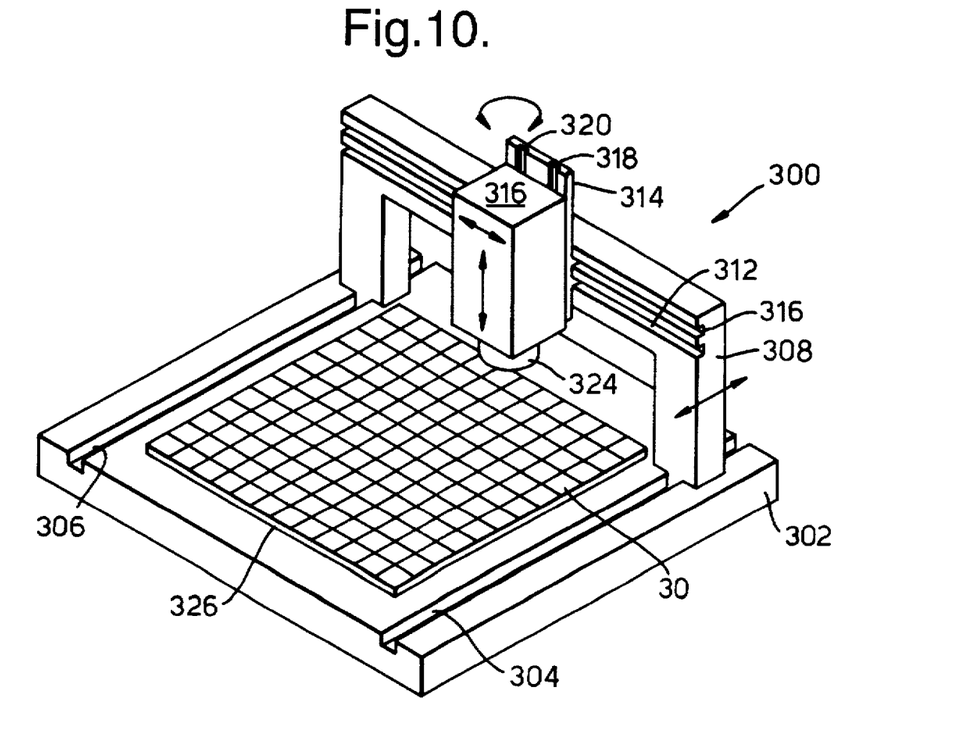
FIGS. 10 and 11 illustrate an alternative embodiment of the present invention for in-tray programmable lead inspection and conditioning.

FIG. 10 shows an alternative embodiment 300 of programmable lead conditioning system of the present embodiment. Begin at base 302, there appears rail 304 and 306 in which transport beam 308 slidably engages. Transport beam 308 includes rails 310 and 312 in which translation bed 314 slides. Conditioning fixture 316 slides within rails 318 and 320 of translation bed 314. Within conditioning fixture 316 is a conditioning device similar to the conditioning tool of the embodiment that appears in FIGS. 2 and 5, above. In addition, conditioning fixture 316 includes thumb 324 for contacting the top of an electronic component package 30. Beneath conditioning fixture 316 appears tray 326 of electronic component packages 30. Associated with conditioning fixture 316 may be a lead inspection viewing point that permits inspecting of the electronic component packages 30 within tray 326.

As is described in connection with FIGS. 1 through 9, above, in-tray programmable lead conditioning system 300 will permit inspection and conditioning of electronic component packages 30 with a single placement of tray 326. In-tray programmable lead inspection system 300 provides the further advantage of in-tray inspection and conditioning. By permitting each electronic component package 30 to remain in its tray 326, no handling or movement is necessary for lead inspection and conditioning. This significantly improves throughput of each electronic component package 30 in its manufacturing processes.

Figure 11:
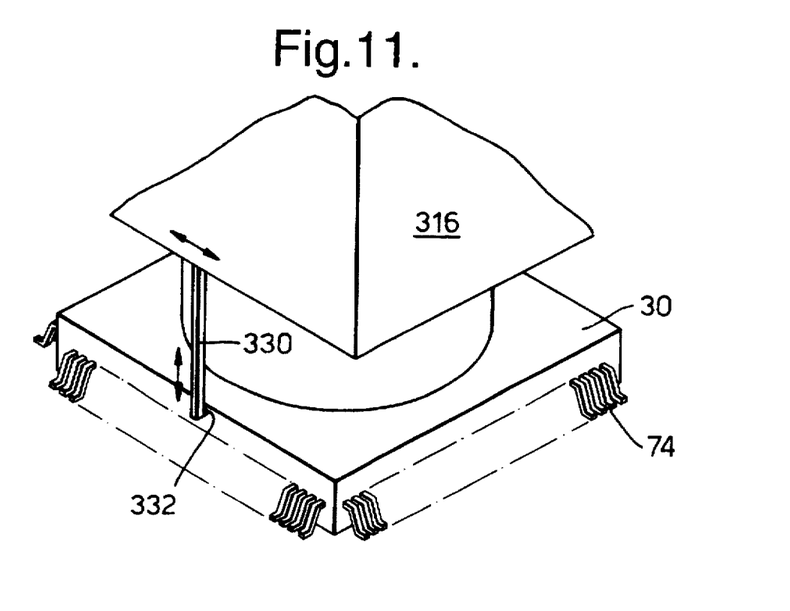

FIG. 11 shows placement of thumb 324 on electronic component package 30. As FIG. 11 illustrates, lead conditioning fixture 316 contains conditioning arm 330. Conditioning arm 330 includes conditioning blade 332. Conditioning blade 332 may contact a lead 74 of electronic component package 30 to perform necessary conditioning. X, Y, and Z translation occurs as translation beam 308 slides in rails 304 and 306, translation bed 314 slides along rails 310 and 312, and conditioning fixture 316 slides in rails 318 and 320 of translation bed 314. Precise manipulation of conditioning arm 330 may be achieved. Alternatively, a separate X, Y, Z translation scheme may be incorporated in conditioning fixture 316 for more precise placement of conditioning arm 330 and, thus, conditioning blade 332. Thumb 324 applies positive pressure on electronic component package 30 so that application of conditioning force to lead 74 conditioning blade 332 does not cause electronic component package 30 to move.

In FIG. 11, it is clear that by rotating conditioning arm 330 within conditioning fixture 316 all the sides of electronic component package 30 that include leads may be addressed with a single placement by thumb 324. As such, in-tray programmable lead conditioning system 300 provides the technical advantages of not only permitting in-tray inspection and conditioning, but also of inspecting and conditioning all leads of electronic component package 30 with a single placement of conditioning fixture 316. In performing the desired conditioning for leads 74 of electronic component package 30 using in-tray programmable lead conditioning system 300, calculations similar to those described above in connection with lead inspection system 18 may be translated according to the orientation of the lead inspecting lens, as appropriate.

Although the invention has been described in detail herein with reference to the illustrative embodiments, it is to be understood that this description is by way of example only and is not to be construed in a limiting sense. For example, conditioner blade 70 may have multiple blades or may be a bar that would move all leads up and down according to a specified program or a set of parameters in a particular program. Furthermore, any number of tools to be designed to push, pull, grab or otherwise manipulate leads 74 of the electronic component package 30. In addition, manipulator 22 may use any number of motion generators such as stepper motors, servomotors, linear stepper motors, pneumatic actuators, etc. Controller 24 may be any type of processor capable of performing the above-described functions with both lead inspection system 18 and manipulator 22. It is to be further understood that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A lead conditioning system for an electronic component package having a set of leads for connecting electronic circuits of the electronic component package to external circuitry, the lead conditioning system comprising:

a table for holding the electronic component package and providing access to said set of leads by a conditioning tool for conditioning respective leads of said set of leads;

a lead inspection system for inspecting said set of leads of said electronic component package on said table;

a conditioning tool for selectively contacting only one lead of said set of leads to condition said one lead with said electronic component package held on said table;

a manipulator for moving said conditioning tool to a position to selectively move only said one lead of said set of leads to condition said one lead of said set of leads; and a control system for controlling the operation of said manipulator.

2. The lead conditioning system of claim 1, wherein said table comprises a rotary table operable to rotate the electronic component package to allow access to respective sets of leads on all sides of the electronic component package.

3. The lead conditioning system of claim 1, wherein said conditioning tool comprises a conditioner arm having a conditioner blade for contacting said only one lead.

4. The lead conditioning system of claim 1, wherein said manipulator moves said conditioning tool in three dimensions for conditioning said one lead of the set of leads in coplanarity, pitch, and tweeze.

5. The lead conditioning system of claim 1, wherein said control system includes a feed back loop to condition said one lead of said set of leads based on information from said lead inspection system.

6. The lead conditioning system of claim 1, wherein said control system further comprises a database including parameters associated with a plurality of electronic component packages for determining desired amounts of conditioning for the selected leads.

7. The lead conditioning system of claim 1, wherein said table is configured to hold the electronic component package in a tray, and further wherein said conditioning tool and said manipulator are configured for conditioning the set of leads with the electronic component package in the tray.

8. A method of conditioning a set of leads of an electronic component package, the method comprising the steps of:

holding the electronic component package on a table which provides for access to a set of leads of said electronic component package for inspection and conditioning of at least selected leads of said set of leads respectively;

inspecting said set of leads while holding said electronic component package on said table;

selectively contacting only one lead of said set of leads using a conditioning tool;

moving said conditioning tool with a manipulator to a position to move said one lead of said set of leads to condition said one lead of said set of leads while holding said electronic component package on said table; and controlling the operation of said manipulator using a control system.

9. The method of claim 8, further comprising the steps of providing said table as a rotary table and rotating the electronic component package on said rotary table for accessing all sides of the electronic component package by at least one of an inspection system for inspecting multiple sets of leads and said conditioning tool.

10. The method of claim 8, further comprising the step of selectively contacting said only one lead of the electronic component package by using said conditioning tool comprising a conditioner arm having a conditioner blade.

11. The method of claim 8, further comprising the step of conditioning said only one lead of said set of leads in coplanarity, pitch, and tweeze using the manipulator to move said conditioning tool in three dimensions.

12. The method of claim 8, further comprising the step of calculating the amount of positioning required to condition said one lead of said set of leads using the control system.

13. The method of claim 8, further comprising the step of associating the control system with a database containing parameters associated with a plurality of electronic component packages.

14. The method of claim 8, further comprising the step of conditioning the set of leads on the electronic component package while the electronic component package is in a tray.

15. A lead conditioning system for an electronic component package having a set of leads extending therefrom, the leads of said set of leads being disposed in substantially side by side relationship to each other, said leads being adapted for connecting electronic circuits of said electronic component package to external circuitry, said lead conditioning system comprising:

a table for holding said electronic component package in such a way as to provide access to a set of leads on said package by a conditioning tool for conditioning respective ones of leads of said set of leads;

a conditioning tool mounted for movement with respect to said table for selectively contacting any one lead of said set of leads to condition said one lead with said electronic component package held on said table, said tool including a conditioner arm and a conditioner blade supported thereon for engagement with said one lead;

a manipulator connected to said arm, said manipulator being operable to move said tool in three dimensions for conditioning said one lead in coplanarity, pitch and tweeze; and a control system for controlling the operation of said manipulator to effect conditioning of any one of said leads, respectively.

16. The lead conditioning system set forth in claim 15 including:

a lead inspection system for inspecting the leads of said set of leads while said electronic component package is held on said table.

17. The lead conditioning system set forth in claim 15 wherein:

said table comprises a rotary table which is operable to rotate said electronic component package to predetermined positions to provide access to plural sets of leads of said electronic component package for conditioning any one lead of said plural sets of leads.

18. The lead conditioning system set forth in claim 15 wherein:

said control system includes means operable to calculate the amount of positioning required to condition any one of said leads as a result of inspecting said leads of said electronic component package while disposed on said table.

19. The lead conditioning system set forth in claim 15 wherein:

said table is operable to hold a tray, said tray including a plurality of electronic component packages disposed thereon, and said manipulator is operable to manipulate said conditioning tool to condition any one lead of a set of leads of any one of said plurality of electronic component packages disposed in said tray.

20. A lead conditioning system for an electronic component package having plural sets of leads extending therefrom, the leads of each set of leads being disposed in substantially side by side relationship to each other, said leads being adapted for connecting electronic circuits of said electronic component package to external circuitry, said lead conditioning system comprising:

a rotary table for holding said electronic component package in such a way as to provide access to plural sets of leads on said electronic component package by a conditioning tool for conditioning a predetermined number of leads of a set of leads in a predetermined position of said table;

a conditioning tool mounted for movement with respect to said table for selectively contacting a predetermined number of leads of each set of leads in respective selected rotary positions of said table to condition said predetermined number of leads, respectively, with said electronic component package held on said table, said tool including a conditioner arm and a conditioner member supported thereon for engagement with said predetermined number of leads, respectively;

a manipulator connected to said arm, said manipulator being operable to move said tool in three dimensions for conditioning said predetermined number of leads in at least one of coplanarity, pitch and tweeze; and a control system for controlling the operation of said manipulator to effect conditioning of said leads of said electronic component package.

21. The lead conditioning system set forth in claim 20 including:

a lead inspection system for inspecting each set of leads while said electronic component package is held on said table.

22. The lead conditioning system set forth in claim 20 wherein:

said conditioner member comprises a bar for simultaneously contacting plural leads of a set of leads for moving said plural leads together in one of planarity, pitch and tweeze.

* * * * *